(12) United States Patent
Chen et al.

(10) Patent No.: US 7,592,987 B2
(45) Date of Patent: Sep. 22, 2009

(54) CURRENT-SCALING ACTIVE THIN FILM TRANSISTOR CIRCUIT STRUCTURE FOR PIXEL OF DISPLAY DEVICE

(75) Inventors: Pei-Ming Chen, Tao Yuan Shien (TW); Yen-Lin Wei, Tao Yuan Shien (TW); An-Chih Wang, Tao Yuan Shien (TW); Yen-Chung Lin, Hsinchu (TW); Jian-Zhi Huang, Hsinchu (TW); Chia-Feng Yang, Hsinchu (TW); Jiun-Shiau Wang, Hsinchu (TW); Han-Ping Shieh, Hsinchu (TW)

(73) Assignees: Quanta Display, Inc., Tao Yuan, Shien (TW); National Chiao Tung University, Hsinchu (TW)

( * ) Notice: Subject to any disclaimer, the term of this patent is extended or adjusted under 35 U.S.C. 154(b) by 700 days.

(21) Appl. No.: 11/365,515

(22) Filed: Mar. 2, 2006

(65) Prior Publication Data
US 2007/0057294 A1    Mar. 15, 2007

(30) Foreign Application Priority Data
Sep. 9, 2005   (TW) ............................... 94131193 A (51) Int. Cl.
*G09G 3/32*   (2006.01)

(52) U.S. Cl. ....................................................... 345/82
(58) Field of Classification Search .................... 345/82
See application file for complete search history.

(56) References Cited

U.S. PATENT DOCUMENTS 6,943,564 B2 * 9/2005 Yoshida et al. ............... 324/658
2004/0196275 A1 * 10/2004 Hattori ......................... 345/204

* cited by examiner

*Primary Examiner*—Richard Hjerpe
*Assistant Examiner*—Dorothy Webb
(74) *Attorney, Agent, or Firm*—Bacon & Thomas, PLLC (57) ABSTRACT

An active TFT circuit structure with current scaling function is disclosed, which includes a current source, a data line, a scan line, a direct current voltage source, capacitors and four transistors, wherein the capacitors form a cascade structure. During the ON-state, the two of the transistors are turn-on based on the voltage provided by the scan line, so that the data current provided by the current source flows through the data line-and the transistor which is one of the opened transistors, thereby arriving an emitting light element and the transistor connected to the emitting light element. When the pixel circuit changes from ON- to OFF-state, the voltage of the node between the storage capacitors reduces due to the feed-through effect of one of storage capacitor, thereby reducing the driving current of the emitting light element. Therefore, it can be achieved the current scaling function.

20 Claims, 10 Drawing Sheets

CURRENT-SCALING ACTIVE THIN FILM TRANSISTOR CIRCUIT STRUCTURE FOR PIXEL OF DISPLAY DEVICE

BACKGROUND OF THE INVENTION

1. Field of the Invention

The present invention relates to active thin film transistor circuit structure with current scaling function and, more particularly, to active thin film transistor structure applied for active light emitting device or the pixel circuit for an array of a display panel.

2. Description of Related Art

Organic light emitting diodes (OLEDs) attract people's attention recently since they are capable of illuminating without backlight modules to display images. In addition, OLEDs also have other advantages such as high contrast ratio, high brightness, wide viewing angle, high color saturation, and short response time. Moreover, OLEDs are light, thin, and low power consuming. Hence, OLEDs are possible to be widely used for displaying images.

The common transistor circuit for driving display devices can be a voltage-driven transistor circuit. However, this voltage-driven circuit and the method cannot compensate the characteristics variance caused by time-dependent decay of thin film transistor, the variation of the threshold voltage, and the variation of the field effect mobility. Therefore, the distribution of the brightness of the display devices is not uniform.

Figure 1:
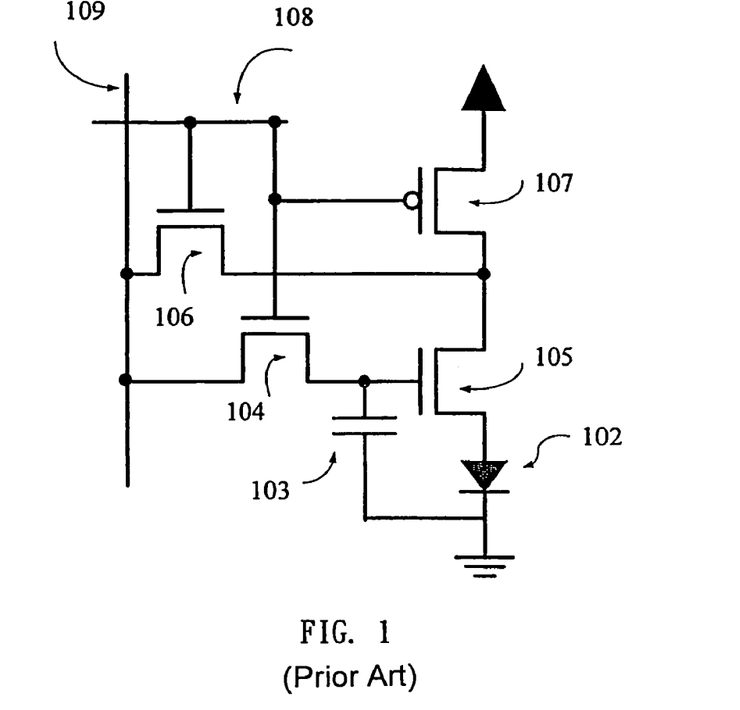
FIG. 1 is a diagram of a current source circuit for driving a pixel of prior arts.

Another current driven circuit is shown in FIG. 1. The corresponding elements of the driven circuit are shown in table 1. The corresponding elements of the driven circuit are shown in table 1. The current driven circuit works by retrieving current from the external integrated circuits directly, and further homogenizes the distribution of brightness by compensating the variation of the threshold voltage of the transistor 105 and that of the mobility. Unfortunately, parasitic capacitors exist and generate as the data lines 109 intersects scanning lines 108. When the light-emitting devices 102 display in low gray levels, the driving current has to charge the parasitic capacitors and the storage capacitors first. Therefore, the response time of the light-emitting devices 102 is seriously delayed.

TABLE 1

| | Function of the element | Characteristics |
|---|---|---|
| The required element | | |
| Transistor 104 | Switch | 1. being able to compensate the variation of the transistor 105 |
| Transistor 106 | Switch | |
| Transistor 107 | Switch | |
| Storage capacitor 103 | Storing voltages for turning on the transistor 105 and for passing current | 2. without the function of reducing the current |
| Auxiliary element | | |
| Transistor 105 | Driving | 3. serious delaying the response time for low gray level |
| Light-emitting 102 | Displaying | |

Figure 2:
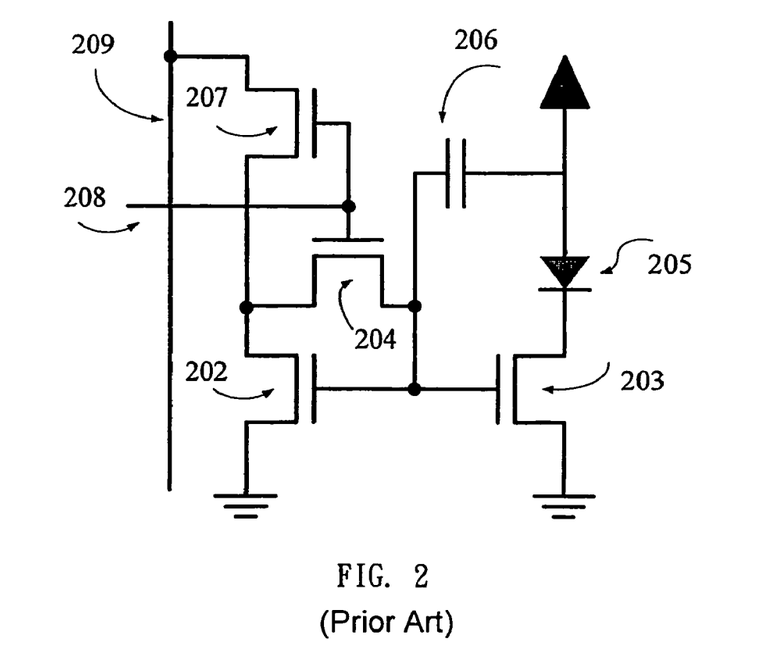
FIG. 2 is a diagram of a current mirror circuit for driving a pixel of prior arts.

Another known current driven circuit by accompanying current mirror is shown in FIG. 2. According to the third illustration of the characteristic column of the table 2, it is known that the current scaling ratio needs to be increased if the improvement of the delaying of the response time is required. Furthermore, the current scaling ratio is proportional to the ratio of the geometrical size of the transistor 202 to that of the transistor 203. For example, when each pixel area of a display device is 125×125 $\mu m^2$ pixel area and the width of the transistor 203 is 50 μm, the ratio of the geometrical size of the transistor 202 to that of the transistor 203 is limited under 2.5/1. In addition, the aperture ratio, i.e. the ratio of the area on the pixel without pixel circuit to the total area of the pixel, is reduced as the geometrical size of transistor 202 increases.

TABLE 2

| | Function of the element | Characteristics |
|---|---|---|
| The required element | | |
| Transistor 202 | Switch | 1. to compensate the variation of the transistor 203 |
| Transistor 204 | Switch | |
| Transistor 207 | Switch | |
| Storage capacitor 206 | Storing voltages for turning on the transistor 203 and for passing current | 2. being able to scale the current |
| | | 3. the ratio of current scaling is constant and proportional to |
| Auxiliary element | | |
| Transistor 203 | Driving | the ratio of the width of the transistor 202 to that of the transistor 203. |
| Light-emitting 205 | Displaying | |

According to the description illustrated above, the display industry has a demand for an active current-scaling transistor circuit to improve the time delaying as low gray level is provided for displaying.

SUMMARY OF THE INVENTION

The current-scaling active thin film transistor circuit structure for a pixel of a display device of the present invention can shorten the delaying time of the response of the light-emitting device of the display device in the prior art.

The current-scaling active thin film transistor circuit structure for a pixel of a display device of the present invention can compensate the variation of the time decaying characteristic of the driving transistors.

The current-scaling active thin film transistor circuit structure for a pixel of a display device of the present invention can remain the aperture ratio of the pixel unchanged.

The display devices of the current-scaling active thin film transistor circuit structure with the same advantages illustrated above are also provided in the present invention.

Figure 3A:
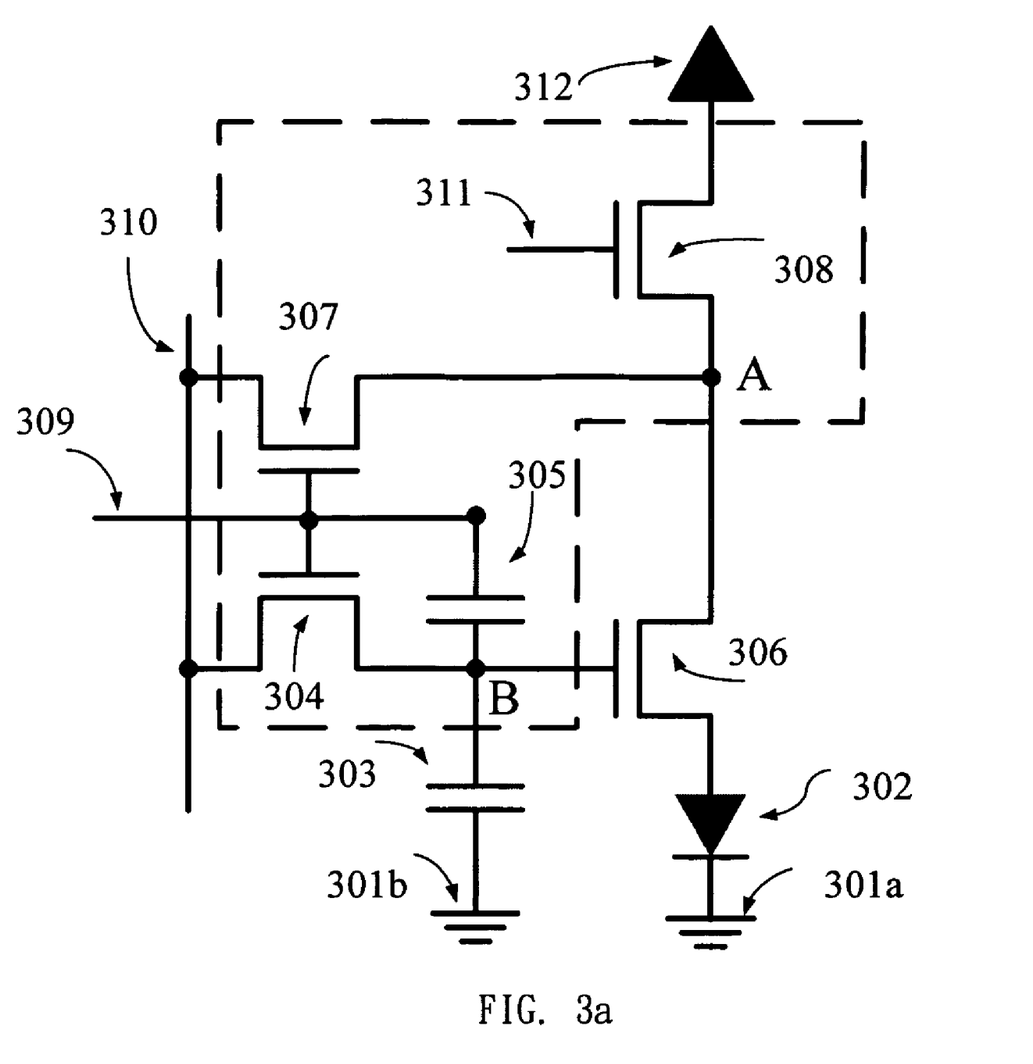
FIG. 3a is a diagram of a circuit for driving a pixel of the second embodiment of the present invention.

As shone in FIG. 3a, the current-scaling active thin film transistor circuit structure for a pixel of a display device of the present invention can be applied to an active light-emitting device, or to the pixel circuit of a display panel with an array. Briefly, the current-scaling active thin film transistor circuit structure for a pixel of a display device of the present invention includes a plurality of switching transistors 304, 307, 308, a driving transistor 306, a plurality of storage capacitors 303, 305, and a lighting unit 302.

Among them, the gate of the first switching transistor 307 is electrically connected to the gate of the second switching transistor 304, and a scanning line 309. The first terminal of the first switching transistor 307 and the first terminal of the switching transistor 304 are electrically connected to a data line 310. The third switching transistor 308 is electrically connected to a direct current voltage signal line 312 and the first terminal of the fourth driving transistor 306 respectively. Furthermore, the second terminal of the fourth driving transistor 306 is electrically connected to a light-emitting unit 302. In addition, one terminal of the first storage capacitor 303 is grounded. The other terminal of the first storage capacitor 303 is electrically connected to the gate of the fourth driving transistor 306. One terminal of the second storage capacitor 305 is electrically connected to the gate of the first switching transistor 307, and the gate of the second switching transistor 304. Moreover, the other terminal of the second storage capacitor 305 is electrically connected to one terminal of the first storage capacitor 303 and the gate of the fourth driving transistor 306 respectively.

As the pixel circuit of the display of the present invention is in ON-state, the two switching transistor 304, 307 is switched into ON-state according to the voltage provided by the scanning line 309. After the two switching transistor 304, 307 is switched into ON-state, the data current passes through the fourth driving transistor 306 and the light emitting unit 302. As the pixel circuit of the display of the present invention is turned from ON-state to OFF-state, a negative feed-through effect generated in the second storage capacitor 305 results in decreasing of the voltage between the first storage capacitor 303 and the second capacitor 305. This decreasing of the voltage further reduces the current passing through the light-emitting unit 302. Hence, the pixel circuit of the display of the present invention can fill the storage capacitor 303, 305 by large driving current, and further reduce the response time in the time period of ON-state. On the other hand, the pixel circuit of the display of the present invention can display gray level by small driving current in the time period of OFF-state.

The variation of the characteristic time decay of the driving transistor 306, i.e. the variation of the current passing through the light-emitting unit, can be expressed by formula (I)

$$I = (\mu C_{OX} W/2L)(V_{GS} - V_{TH})^2 \quad (I)$$

wherein $\mu$ is the field effect mobility, $C_{OX}$ is the capacitance per unit area of driving transistor 306, W is the width of the driving transistor 306, L is the length of the driving transistor 306, $V_{GS}$ is the voltage difference between the gate of the driving transistor 306 and the anode of the light-emitting unit, $V_{TH}$ is the threshold voltage of the driving transistor 306. When the threshold of the driving transistor 306 changes, the data signal line 310 will modulate the charge of first storage capacitor 303 and that of the second storage capacitor 305 Moreover, the voltage of the gate of the driving transistor 306 is increased to remain ($V_{GS} - V_{TH}$) and the current passing light-emitting unit unchanged. Therefore, the driving current can be stabilized.

In addition, if the capacitance of the storage capacitors are constant, and the size of the switching transistor 304, 307, 308 and that of the driving transistor 306 does not change, the aperture ratio can keep constant by adjusting the ratio of the capacitance of the first storage capacitor to the capacitance of the second capacitor within a range complied with a predetermined scaling ratio.

Other objects, advantages, and novel features of the invention will become more apparent from the following detailed description when taken in conjunction with the accompanying drawings.

DETAILED DESCRIPTION OF THE PREFERRED EMBODIMENT

FIG. 3a is a circuit diagram of one embodiment of the current-scaling active thin film transistor circuit of the present invention. The related elements are listed and illustrated in table 3.

TABLE 3

| | Function of the element | Characteristics |
|---|---|---|
| The required element | | |
| Transistor 304 | Switch | 4. being able to compensate the variation of the transistor 306 |
| Transistor 307 | Switch | |
| Transistor 308 | Switch | |
| Storage capacitor 305 | Storing voltages for scaling current | 5. being able to scale the current |
| Auxiliary element | | |
| Transistor 306 | Driving | 6. having variable ratio of current scaling |
| Light-emitting 302 | Displaying | |
| Storage capacitor 303 | Storing voltage for turning on transistor 306 to pass current | |
| Control signal | Transmitting position | |
| $V_{SCAN}$ | Scanning line 309 | |
| $I_{DATA}$ | Data line 310 | |
| $V_{CTRL}$ | Control line 311 | |
| $V_{DD}$ | Direct voltage line 312 | |

In the present embodiment, the transistors 304, 306, and 308 are N-type thin film transistors (TFTs). The connection of these transistors is shown in FIG. 3a. In addition, the light-emitting unit 302 can be a LED element such as an organic light emitting unit (OLED), or a polymer light-emitting unit (PLED).

In addition, please notice that a dotted line in FIG. 3a marks the major difference between the circuit of the present invention and that of the prior art. In the circuit of the present invention, the gates of the transistor 304, 307 are connected to each other. Moreover, the source of the transistor 304 is electrically connected to the source of transistor 307. In addition, a storage capacitor is arranged between the storage capacitor and the transistor 304 and 307. Through the circuit illustrated above, the circuit of the present embodiment can change the ratio of current scaling.

The circuit of the present invention is operated in two states, i.e. the ON state, and the OFF state. The details are listed in table 4 and table 5.

TABLE 4

| step | Operation | Result | Effect |
|---|---|---|---|
| 1 | $V_{SCAN}$ is high | Transistors 304 and 307 is turned on | Transistor 306 is operated in the saturation region. |
| 2 | $V_{CTRL}$ is low (0 V) | Transistor 308 is turned off | Avoiding the current to pass through the transistor 308 from direct current voltage line 312 |
| 3 | $I_{DATA}$ is adequate current | The current passing through the transistors 306, 307 to the light emitting unit 302 | The current $I_{OLED-ON}$ passing through the light-emitting unit 302 is close to $I_{DATA}$. |

As the threshold voltage of transistor 306 changes in step 3, the voltage of the gate of transistor 306 will be adjusted to an adequate voltage by the control signal $I_{DATA}$ to allow the control signal $I_{DATA}$ to pass.

As the threshold voltage of transistor 306 changes, the voltage of the gate will be adjusted to allow the control signal $I_{DATA}$ to pass through the transistor 306 to the light-emitting unit 302. The current passing through the light-emitting unit 302 is $I_{OLED\_ON}$.

Figure 4A:
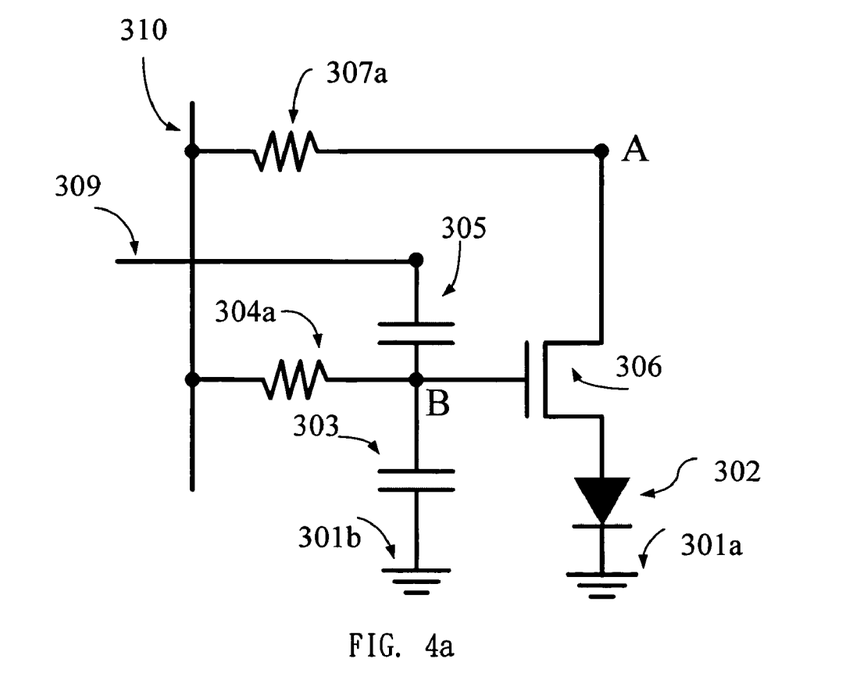
FIG. 4a is a diagram of an equivalent circuit of the circuit for driving a pixel in ON-state in the first embodiment of the present invention.

In addition, the voltage $V_{B\_ON}$ of the gate of the transistor 306 is stored in the storage capacitor 303, and 305. The equivalent circuit of the circuit of the present embodiment in ON state is shown in FIG. 4a. The 304a in FIG. 4a is the equivalent resistor of the transistor 304 in ON-state. The 307a in FIG. 4a is the equivalent resistor of the transistor 307 in ON-state.

TABLE 5

| Step | Operation | Result | Effect |
|---|---|---|---|
| 1 | $V_{SCAN}$ is low (0 V). | Transistor 304 and 307 is turned off. | The negative feed through effect reduce the voltage of the gate of transistor 306 |
| 2 | $V_{CTRL}$ is high. | Transistor 308 is turned on. | The current passes through the transistor 306 to the light-emitting unit from direct current voltage line 312 |

As the voltage $V_{SCAN}$ of the control line is switched from high to 0 in step 1, the gate voltage of the transistor 306 is reduced from $V_{B\_ON}$ to $V_{B\_OFF}$ owing to the negative feed-through effect of the storage capacitor 303, and 305. The voltage can be known from formula (2):

$$V_{B\_OFF} = V_{B\_ON} - \Delta V_{SCAN} \cdot \frac{C_{ST2} \| C_{OV\_T2}}{C_{ST1} + C_{ST2} \| C_{OV\_T2}} \quad (2)$$

Wherein $C_{OV-T2}$ is the parasitic capacitance between the gate and the drain/source of the transistor 304. The $V_{B\_OFF}$ is stored in the storage capacitor to maintain the transistor in ON state during the time period for displaying a frame.

Figure 4B:
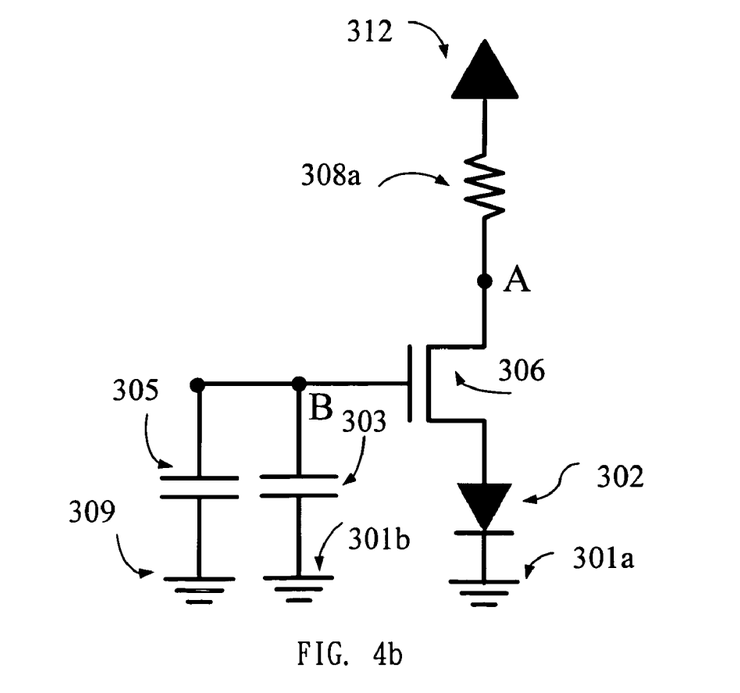
FIG. 4b is a diagram of an equivalent circuit of the circuit for driving a pixel in OFF-state in the first embodiment of the present invention.

Since the drain of the transistor 308 is electrically connected to the direct current voltage line 312, the transistor is operated in the saturation region, and the current $I_{OLED\_ON}$ from the direct current voltage line 312 passes through the equivalent resistor 308a, and transistor 306 to the light-emitting unit 302 in step 2. The equivalent circuit is shown in FIG. 4b. The 308a in FIG. 4b is the equivalent resistor of the transistor 308 in ON-state.

As it is switched from ON-state to OFF-state in step 2, the gate voltage of the transistor 306 is reduced, and the driving current of the light-emitting unit reduced from $I_{OLED}\_ON$ to $I_{OLED}\_OFF$ Hence, the current scaling can be achieved. The ratio of current scaling $R_{SCALE}$ can be obtained from formula (3):

$$R_{SCALE} = I_{OLED-ON} / I_{OLED-OFF} \quad (3)$$

According to the formula (2) and (3), the greater capacitance of the storage capacitor 305 can produce higher $R_{SCALE}$ to reduce the driving time of the pixel in ON state. In addition, the greater capacitance of the storage capacitor can also generate low driving current accurately to display low gray level.

Figure 5:
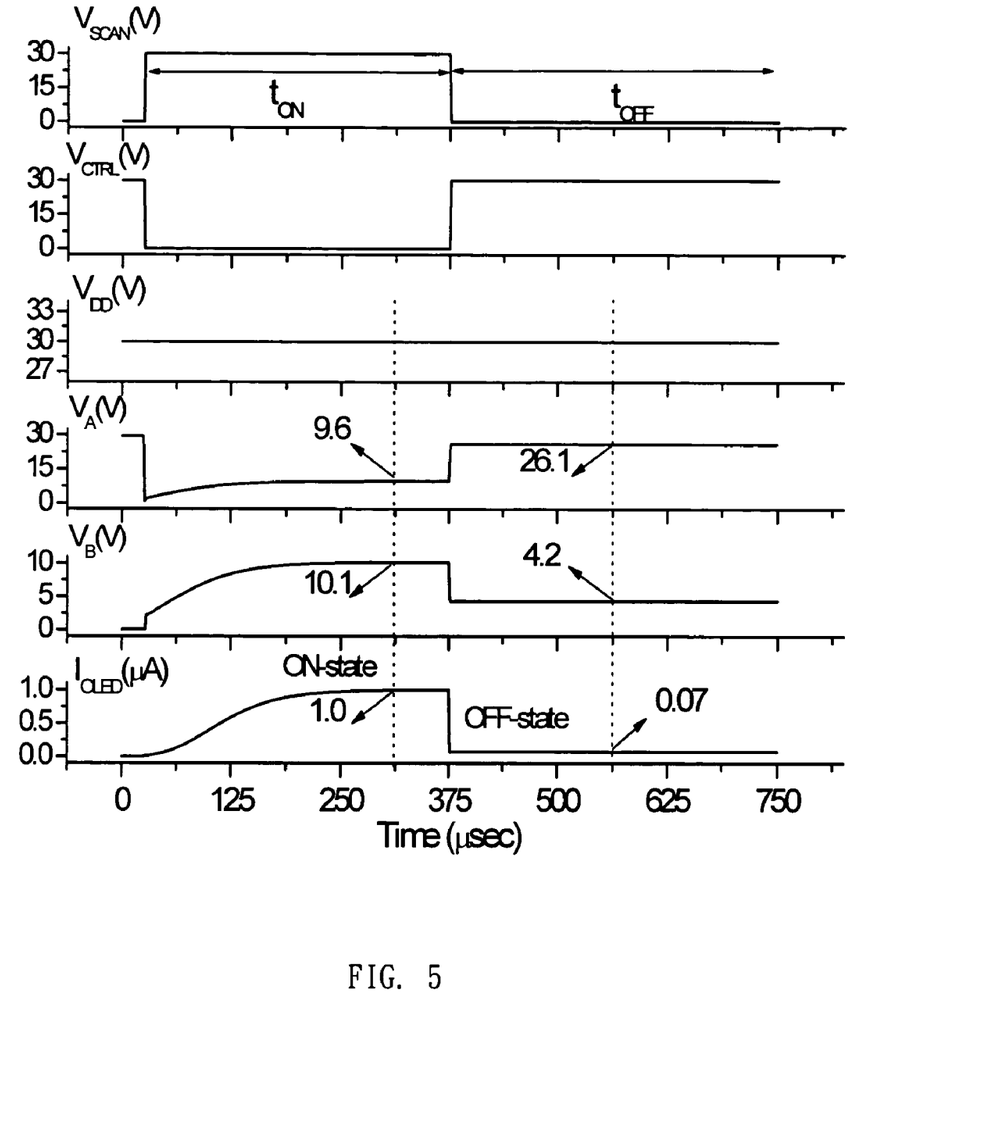
FIG. 5 is the time chart of the circuit of the first embodiment of the present invention.
Figure 6:
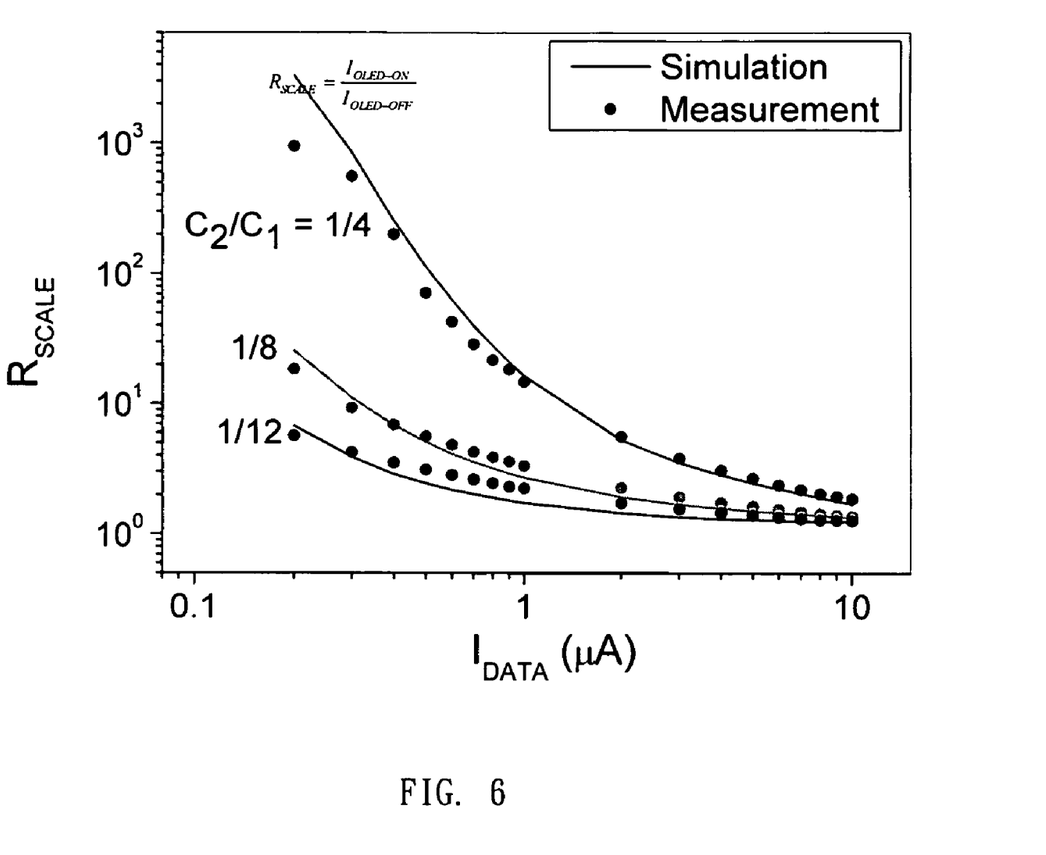
FIG. 6 is the graph of the input current vs. the ratio of current-scaling in the first embodiment of the present invention.

Moreover, the elements, and the parameters of the signals can be seen in FIG. 6. The time chart of the pixel circuit is shown in FIG. 5. The $R_{SCALE}$ can be calculated as 14.2.

TABLE 6

| Element | |
|---|---|
| transistor307 W/L (um) | 50/4 |
| transistor304 W/L (um) | 30/4 |
| transistor308 W/L (um) | 40/4 |
| transistor306 W/L (um) | 50/4 |
| Threshold voltage of transistor $V_{TH}$ (V) | 1.65 |
| Mobility of transistor $\mu_{FE}$ (cm$^2$/V-sec) | 0.54 |
| Capacitance of storage capacitor 303 $C_1$ (pF) | 2.5 |
| Capacitance of storage capacitor 305 $C_2$ (fF) | 625 |
| Control signal | |
| $V_{SCAN}$ (V) | 0~30 |
| $V_{CTRL}$ (V) | 0~30 |
| $V_{DD}$ (V) | 30 |
| $I_{DATA}$ (μA) | 1 |
| Operation time(u sec) | |
| $t_{ON}$ | 350 |
| $t_{OFF}$ | 375 |

TABLE 7

| Operation state | Control signal | State of transistor | Result |
|---|---|---|---|
| On state | $V_{SCAN}$ = 30 V | Transistor 304 ON | $V_{B\_ON}$ = 10.1 V |
| | $V_{CTRL}$ = 0 V | Transistor 307 ON | |
| | $I_{DATA}$ = 1 uA | Transistor 306 ON | $I_{OLED\_ON} \approx$ 1 uA |
| | $V_{DD}$ = 30 V | Transistor 308 OFF | |
| Off state | $V_{SCAN}$ = 0 V | Transistor 304 OFF | $V_{B\_ON}$ = 4.2 V |
| | $V_{CTRL}$ = 30 V | Transistor 306 ON | |
| | $I_{DATA}$ = 1 uA | Transistor 307 OFF | $I_{OLED\_ON} \approx$ 0.07 uA |

In addition, FIG. 6 is a graph of the input current vs. the current scaling ratio of the present invention. According to the relationship shown in FIG. 6, it is easy to derive that the control signal $I_{DATA}$ can be reduced from 10 μA to 0.2 μA, and the $R_{SCALE}$ increases gradually when the capacitance of the storage capacitor 303 is constant, and the capacitance of storage capacitor 305 is varied.

Figure 7:
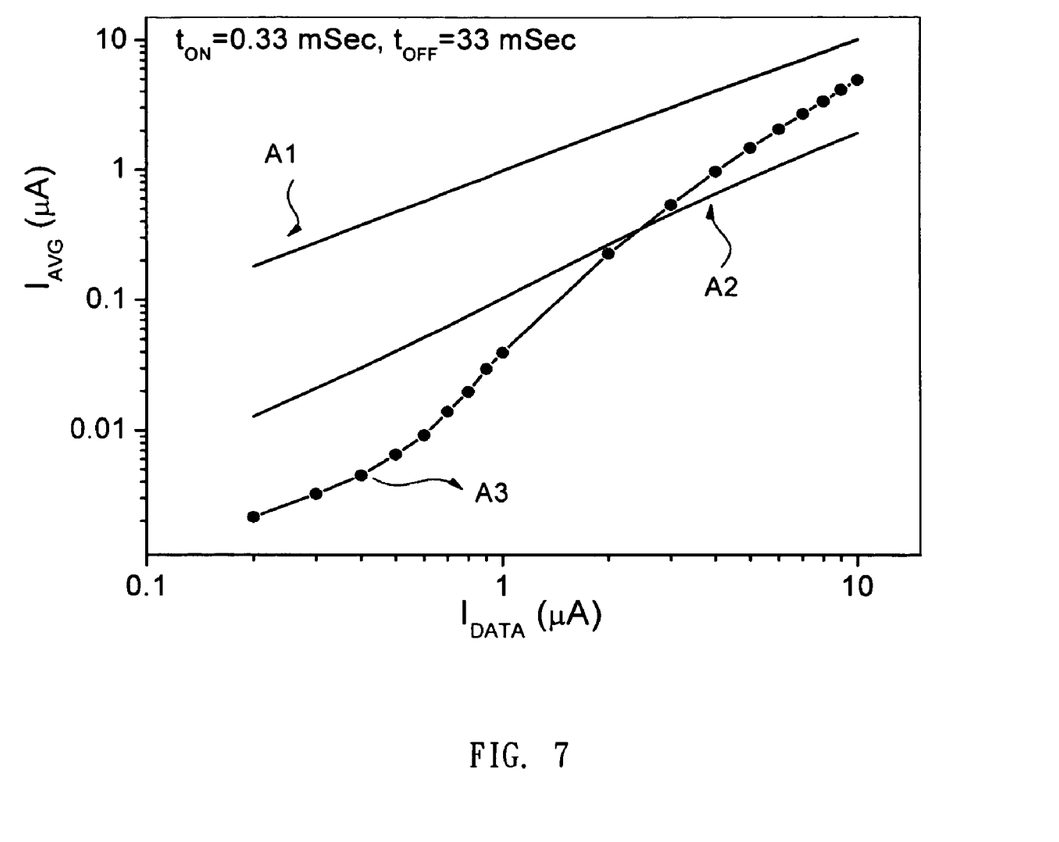
FIG. 7 is the graph of the average driving current vs. the data current.

The comparison result of the current $I_{DATA}$ and the average driving current for driving the light-emitting unit is shown in FIG. 7. In FIG. 7, A1 is the simulation result of the pixel circuit without current scaling function. A2 is the simulation result of a current mirror pixel circuit with constant current scaling. A3 is the simulation result of the pixel circuit of the present invention. From FIG. 7, it is easy to tell the difference between the circuit of the present invention and those of the prior arts. The relationship of the current control signal and the average driving current can be defined in formula (4):

$$I_{AVG} = \frac{I_{OLED\_ON} \cdot t_{ON} + I_{OLED\_OFF} \cdot t_{OFF}}{t_{ON} + t_{OFF}} \qquad (4)$$

wherein $t_{ON}$ and $t_{OFF}$ is the On state time 0.33 ms and the OFF time 33 ms individually.

The comparison result can also be seen in table 8.

TABLE 8

| Driving circuit | Function of scaling current | Current for driving the organic light emitting diode |
|---|---|---|
| Prior art as shown in FIG. 1 | none | 0.2 u~10 uA |
| Prior art as shown in FIG. 2 | yes; constant ratio | 0.01 u~2 uA |
| Circuit shown in FIG. 3a | yes; scaling ratio | 7 n~7 uA |

As the circuit of the present invention is operated for low gray level, a large current scaling ratio can be obtained. In other words, when low gray level frame is displayed, a maximum control signal $I_{DATA}$ can be used for charge to reduce the repose time delay. In addition, the average driving current is in maximum average driving current range.

Figure 9:
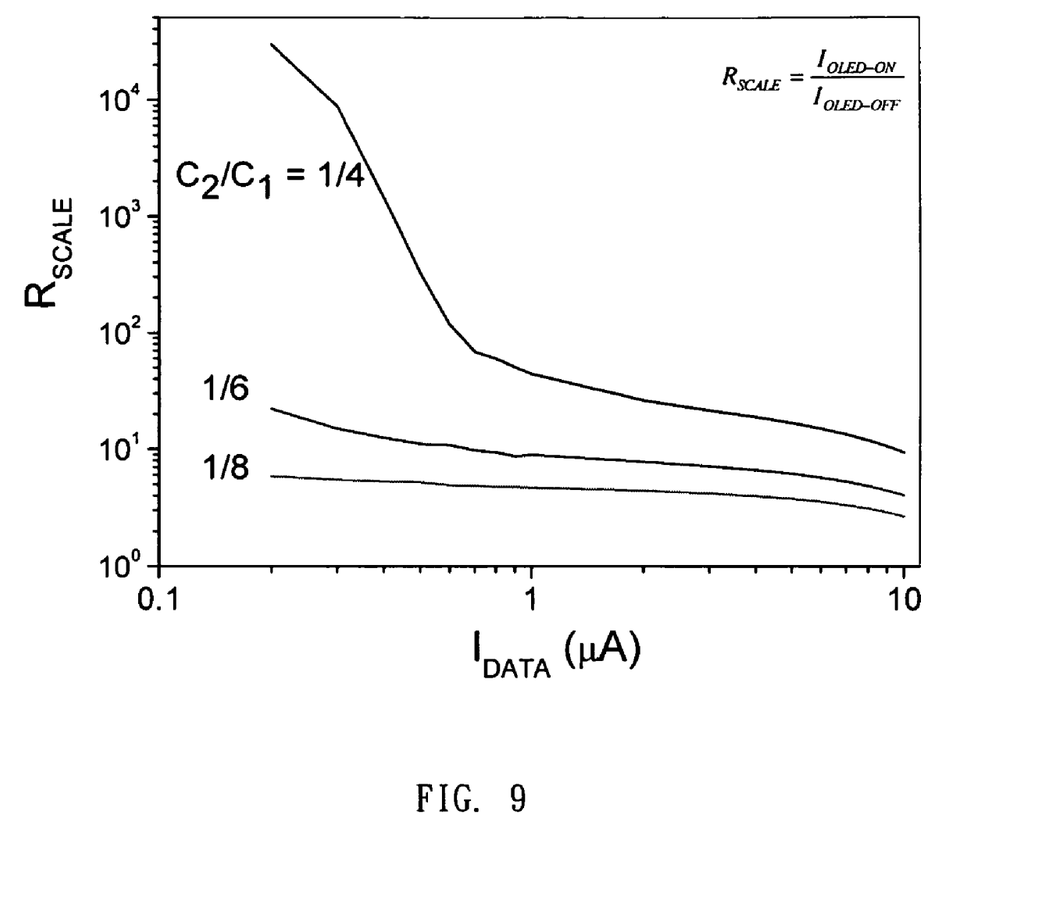
FIG. 9 is the graph of the input current vs. the ratio of current-scaling in the second embodiment of the present invention.

The elements and the parameters second embodiment of the present invention are shown in FIG. 9. The elements and the operation of the elements are similar to that of the first embodiment except that the transistor 308 is replaced by P-type TFT.

TABLE 9

| Element | |
|---|---|
| transistor 304, 306, 307, 308 W/L (um) | 6/4 |
| Threshold of the transistor $V_{TH}$ (V) | 1 |
| Mobility of transistor N-type TFT (cm²/V-sec) | 77 |
| Mobility of transistor P-type TFT (cm²/V-sec) | 85 |
| Capacitance of the storage capacitor 303 $C_1$ (pF) | 1.5 |
| Capacitance of the storage capacitor 305 $C_2$ (fF) | 250 |
| Control signal | |
| $V_{SCAN}$ (V) | −10~10 |
| $V_{CTRL}$ (V) | −10~10 |
| $V_{DD}$ (V) | 10 |
| $I_{DATA}$ (μA) | 1 |
| Operation time (u sec) | |
| $t_{ON}$ | 350 |
| $t_{OFF}$ | 375 |

Figure 8:
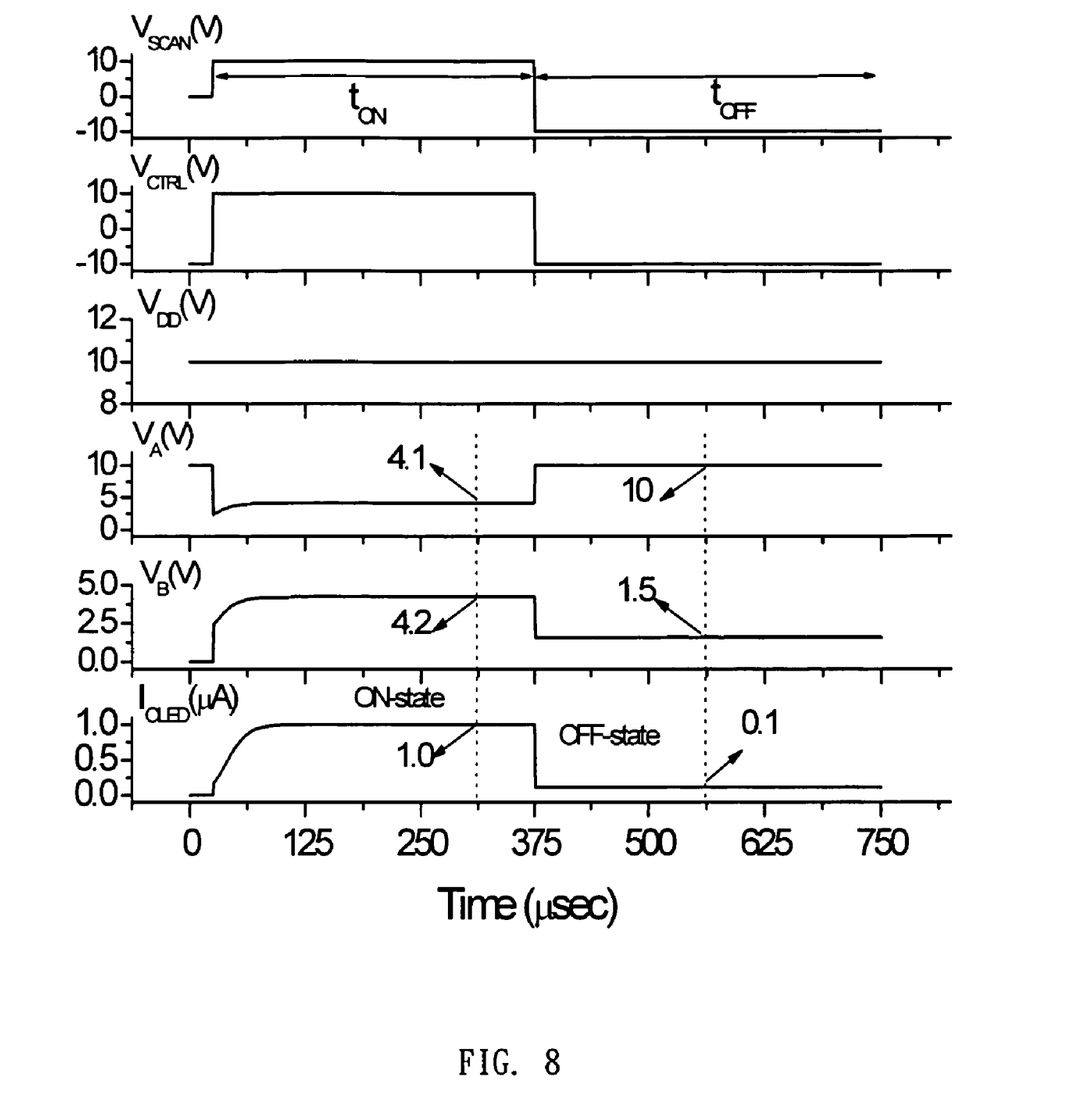
FIG. 8 is the time chart of the circuit of the second embodiment of the present invention.

In the present embodiment, the time chart is shown in FIG. 8. It is also known that the $R_{SCALE}$ is 10 in FIG. 8. In addition, the relationship of the input current to the ratio of the scaling-current is shown in FIG. 9. From the result in FIG. 9, it is known that the circuit of the present embodiment can scale the current.

Figure 3B:
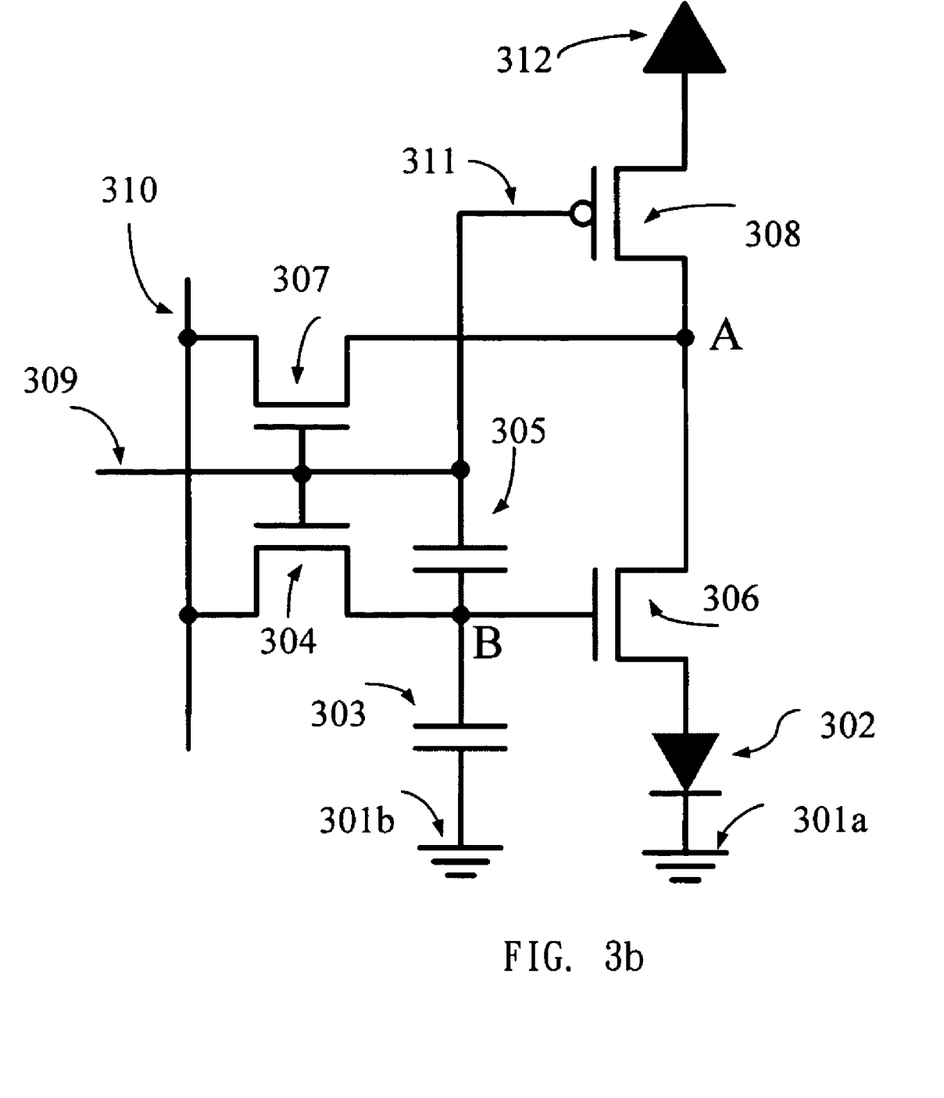
FIG. 3b is a diagram of a circuit for driving a pixel of the third embodiment of the present invention.
Figure 10:
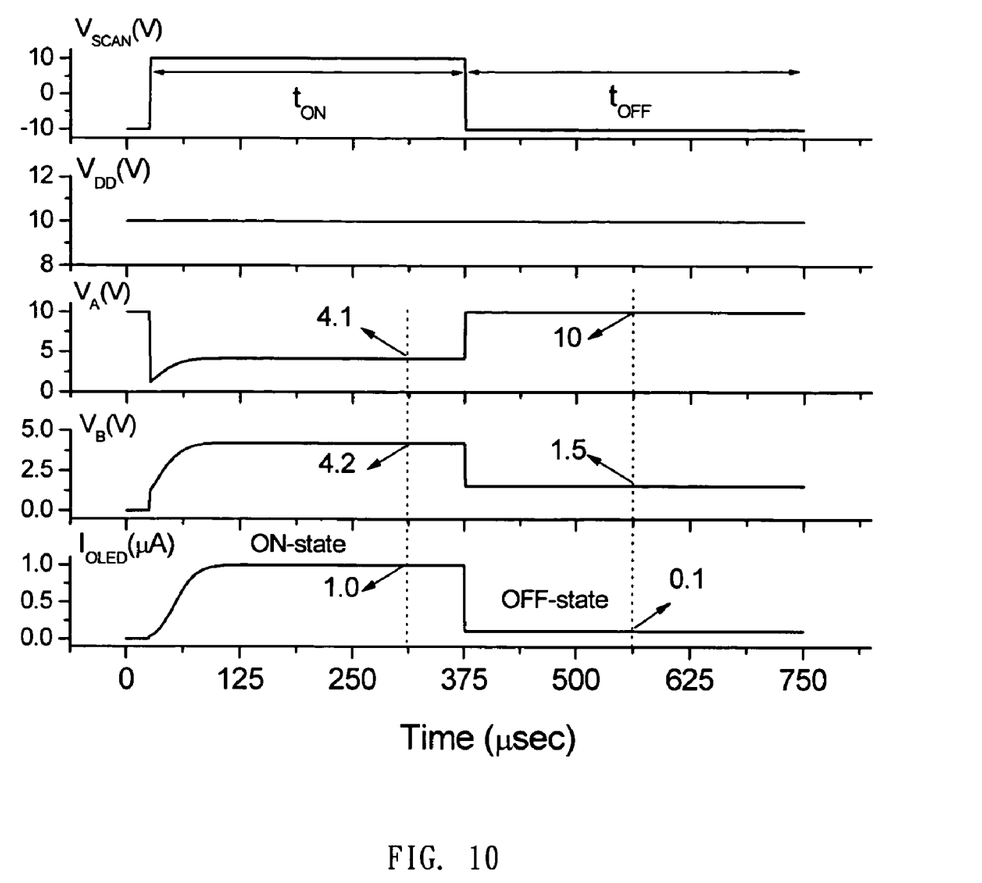
FIG. 10 is the time chart of the circuit of the third embodiment of the present invention.

The third preferred embodiment of the circuit of the present invention is shown in FIG. 3b. The elements of the circuit in FIG. 3b are the same with those in FIG. 3a except that the control line 311 is electrically connected to the scanning line 309. The time chart of the operation of the circuit is shown in FIG. 10. The relationship of the input current to the ratio of the scaling-current is the same with that shown in FIG. 9.

According to the description illustrated above, the circuit of the present invention uses storage capacitors in series and can achieve the scaling of the current. The change of the voltage of the scanning line generates a negative feed-through effect toward one of the capacitor, further reduces the voltage of the gate of the transistor, and reduces the current for driving the light-emitting unit. Hence, the ratio of current-scaling can be adjusted through adjusting the voltage difference of the data line or the capacitance of the storage capacitance. Moreover, the time-delaying of the pixel for displaying frames of low gray level can be reduced, and the variance of the characteristics of the transistor can be compensated.

Although the present invention has been explained in relation to its preferred embodiment, it is to be understood that many other possible modifications and variations can be made without departing from the spirit and scope of the invention as hereinafter claimed.

What is claimed is:

1. A current-scaling active thin film transistor circuit structure for a pixel of a display device, comprising:
    a data line for providing a data current;
    a scanning line;
    a direct-current voltage source;
    a first storage capacitor;
    a second storage capacitor electrically connected to the first storage capacitor in series; and
    a plurality of transistors, comprising a first transistor, a second transistor, a third transistor, and a fourth transistor; wherein one terminal of the third transistor is electrically connected to the direct-current voltage source, the gate of the third transistor is electrically connected to one terminal of the second storage capacitor and the scanning line, one terminal of the fourth transistor is electrically connected to a light-emitting unit, the gate of the first transistor is electrically connected to the gate of the second transistor, and the gate of the first transistor and that of the second transistor are electrically connected to the scanning line.

2. The circuit structure as claimed in claim 1, wherein the first transistor, the second transistor, and the fourth transistor are in ON-state when the pixel is in ON-state.

3. The circuit structure as claimed in claim 1, wherein the third transistor, and the fourth transistor are in ON-state when the pixel is in OFF-state.

4. The circuit structure as claimed in claim 1, wherein a node is located between the first storage capacitor and the second storage capacitor, and the node is electrically connected to the gate of the fourth transistor for reducing the voltage of the node and reducing the current passing through the fourth transistor and the light-emitting unit during the time period that the pixel switches from On-state to OFF-state.

5. The circuit structure as claimed in claim 1, wherein a node is located between the first storage capacitor and the second storage capacitor, and the node is electrically connected to the gate of the third transistor for reducing the voltage of the node and reducing the current passing through the third transistor and the light-emitting unit during the time period that the pixel switches from On-state to OFF-state.

6. The circuit structure as claimed in claim 1, wherein a ratio of the current passing through the light emitting unit as the pixel is in ON-state to the current passing through the light emitting unit as the pixel is in OFF-state is limited by a predetermined current scaling ratio.

7. The circuit structure as claimed in claim 6, wherein the predetermined current scaling ratio increases as the voltage difference provided by the scanning lines increases.

8. The circuit structure as claimed in claim 6, wherein the predetermined current scaling ratio increases as the capacitance of the second capacitor increases.

9. A current-scaling active thin film transistor circuit structure, comprising:
- a first transistor having a first terminal, a second terminal, and a gate;
- a second transistor having a first terminal, a second terminal, and a gate;
- a first storage capacitor having a first terminal, and a second terminal, wherein the first terminal of the first storage capacitor is grounded;
- a second storage capacitor having a first terminal, a second terminal;
- a data line electrically connected to the first terminal of the first transistor, and the first terminal of the second transistor respectively;
- a scanning line electrically connected to the gate of the first transistor, and the gate of the second transistor, the second terminal of the second storage capacitor respectively;
- a third transistor having a first terminal, a second terminal, and a gate; wherein the first terminal of the third transistor is electrically connected to a direct-current voltage source; and
- a fourth transistor having a first terminal, a second terminal, and a gate; wherein the first terminal of the fourth transistor is electrically connected to the second terminal of the first transistor and the second terminal of the third transistor, the gate of the fourth transistor is electrically connected to the second terminal of the second transistor, the second terminal of the first storage capacitor, and the first terminal of the second capacitor, and the second terminal of the fourth transistor is electrically connected to one terminal of the light-emitting unit.

10. The circuit structure as claimed in claim 9, wherein the other terminal of the light-emitting unit is grounded.

11. The circuit structure as claimed in claim 9, wherein the gate of the third transistor is electrically connected to a control line.

12. The circuit structure as claimed in claim 9, wherein the gate of the third transistor is electrically connected to the scanning line, the second terminal of the second storage capacitor respectively.

13. The circuit structure as claimed in claim 9, wherein the first transistor, the second transistor, the third transistor, and the forth transistor are N-type transistor, the first terminals of these transistors are drain, and the second terminals of these transistors are source.

14. The circuit structure as claimed in claim 9, wherein the third transistor is P-type transistor, the first terminal of the third transistor is source, and the second terminal of the third transistor is drain.

15. A current-scaling active thin film transistor circuit structure, comprising:
- a first transistor;
- a data line;
- a scanning line;
- a second transistor, wherein the gate of the second transistor is electrically connected to the gate of the first transistor, the gate of the second transistor is electrically connected to the scanning line, the first terminal of the second transistor and the first terminal of the first transistor are electrically connected to the data line;
- a third transistor electrically connected to a direct-current voltage source and a first terminal of a fourth transistor;
- a first storage capacitor, wherein one terminal of the first storage is grounded, and the other terminal of the capacitor is electrically connected to the gate of the fourth transistor; and
- a second storage capacitor, wherein one terminal of the second capacitor is electrically connected to the gate of the first transistor and with the gate of the second transistor, and the other terminal is electrically connected to one terminal of the first capacitor and the gate of the fourth transistor respectively.

16. The circuit structure as claimed in claim 15, wherein the gate of the third transistor is electrically connected to a control line.

17. The circuit structure as claimed in claim 15, wherein the gate of the fourth transistor is electrically connected to one terminal of the second capacitor, the gate of the first transistor, and the gate of the second transistor respectively.

18. The circuit structure as claimed in claim 15, wherein the second terminal of the fourth transistor is electrically connected to a light-emitting unit.

19. The circuit structure as claimed in claim 15, wherein the third transistor is a P-type transistor.

20. The circuit structure as claimed in claim 15, wherein the third transistor is a N-type transistor.

* * * * *

UNITED STATES PATENT AND TRADEMARK OFFICE
CERTIFICATE OF CORRECTION

PATENT NO.      : 7,592,987 B2                                              Page 1 of 1
APPLICATION NO. : 11/365515
DATED           : September 22, 2009
INVENTOR(S)     : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 874 days.

Signed and Sealed this

Twenty-first Day of September, 2010

David J. Kappos
*Director of the United States Patent and Trademark Office*